(12) United States Patent
Hsu et al.

(10) Patent No.: US 6,562,696 B1
(45) Date of Patent: May 13, 2003

(54) METHOD FOR FORMING AN STI FEATURE TO AVOID ACIDIC ETCHING OF TRENCH SIDEWALLS

(75) Inventors: Jen-Tian Hsu, Banchiau (TW); Wen-Hsiang Tang, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/092,682

(22) Filed: Mar. 6, 2002

(51) Int. Cl.$^7$ ............................................. H01L 21/76
(52) U.S. Cl. ...................................... 438/424; 438/700
(58) Field of Search ................................. 438/424, 700

(56) References Cited

U.S. PATENT DOCUMENTS

| | | | | |
|---|---|---|---|---|
| 4,495,025 A | * | 1/1985 | Haskell | 438/424 |
| 4,916,086 A | * | 4/1990 | Takahashi et al. | 438/424 |
| 5,643,822 A | * | 7/1997 | Furukawa et al. | 438/421 |
| 6,228,279 B1 | * | 5/2001 | Armacost et al. | 216/67 |
| 6,426,300 B2 | * | 7/2002 | Park et al. | 438/700 |

FOREIGN PATENT DOCUMENTS

JP         2001-223207       *  8/2001   ....... H01L/21/3065

OTHER PUBLICATIONS

NN9412475 IBM technical Bulletin Dec. 1994.*
John L. Vossen et al Thin Film Processes II Academic Press, Inc. 1991, p. 35.*

* cited by examiner

Primary Examiner—Carl Whitehead, Jr.
Assistant Examiner—David S Blum
(74) Attorney, Agent, or Firm—Tung & Associates

(57) ABSTRACT

A method for forming a shallow trench isolation feature to avoid acidic etching of trench sidewalls including providing a semiconductor substrate having an overlying silicon nitride layer; photolithographically patterning the silicon nitride layer to expose a portion of the silicon nitride layer; anisotropically etching through a thickness of the portion of the silicon nitride layer to form a hardmask opening exposing a portion of the semiconductor substrate; blanket depositing a polymer layer according to a plasma deposition process including at least partially covering the sidewalls and bottom portion of the hardmask opening; and, anisotropically etching a trench opening through a thickness portion of the semiconductor substrate according to the hardmask opening.

17 Claims, 2 Drawing Sheets

METHOD FOR FORMING AN STI FEATURE TO AVOID ACIDIC ETCHING OF TRENCH SIDEWALLS

FIELD OF THE INVENTION

This invention generally relates to methods for forming shallow trench isolation (STI) features and more particularly to a method for forming an STI feature to avoid acidic etching of trench sidewalls.

BACKGROUND OF THE INVENTION

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and shallow trench isolation features. Reliable formation of these interconnect features is very important to the success of ULSI and to the continued effort to increase circuit density and quality on individual substrates and die.

Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is the preferred electrical isolation technique especially for a semiconductor chip with high integration. In general, conventional methods of producing an STI feature include forming a hard mask over the trench layer, patterning a photoresist etching mask over the hard mask, etching the hard mask through the photoresist etching mask to form a patterned hard mask, and thereafter etching the trench in, for example, a silicon substrate to form the STI feature. Subsequently, the photoresist etching mask is removed and the STI feature is back-filled with a dielectric material.

For example, in a typical STI formation process, STI features are etched in a sequential process flow in a multi-chamber apparatus where the mask layers are etched in one chamber and the silicon trench is etched in another chamber. Dry etching is performed by way of a plasma or reactive ion etch (RIE). Typically, in a plasma etching process an etchant source gas supplied to an etching chamber where the plasma is ignited to generate ions from the etchant source gas. Ions are then accelerated towards the process wafer surface, frequently by a voltage bias, where they impact and remove material (etch) from the process wafer. Various gas chemistries are used to provide variable etching rates for different etching target materials. Frequently used dry etchant source gases include fluoro-hydrocarbons to etch through a metal nitride layer for example silicon nitride (SiN), and chlorine ($Cl_2$) and HBr to etch through a silicon layer to form the etched shallow trench isolation (STI) feature.

In forming the STI structures, one technique involves the layering of dielectric films on a silicon substrate. A typical prior art process begins with a silicon substrate, upon which a thin layer of silicon dioxide is formed, for example about 100 Angstroms, referred to a pad oxide, to minimize thermal stresses in subsequent processing steps. Following the pad oxide deposition, a substantially thicker layer of silicon nitride is deposited over the silicon nitride layer, for example, about 1800 Angstroms. The silicon nitride layer is photolithographically patterned and etched to form a hard mask pattern for subsequent etching of a trench feature for an STI structure. After stripping of the photoresist by an oxygen containing dry plasma etching process, trenches are etched into an underlying silicon layer. In a typical process, the trench may be then lined with a dielectric layer such as silicon oxynitride and then filled with an insulating oxide, for example silicon dioxide, by an HDP-CVD process. A CMP planarization process is then used to remove excess oxide with the silicon nitride layer acting as a polishing stop. Subsequently, the silicon nitride layer is removed by a wet etching process with hot phosphoric acid.

Recently, in the manufacture of ultra low power and other semiconductor devices, it has become advantageous to isotropically etchback the silicon nitride layer following the trench etching process to etchback the sidewalls of the silicon nitride layer overlying the trench. After etchback the width of the trench opening is smaller than the width of the silicon nitride hardmask opening overlying the trench to leave an exposed recessed area surrounding the trench. The etchback process leaving an exposed recessed area surrounding the trench has been found advantageous to improve device performance where critical dimensions in the active device area involve forming smaller linewidths, for example, in 0.15 micron and 0.13 micron technology devices. For example, referring to FIG. 1A is shown a silicon nitride layer 16 overlying a semiconductor substrate 12 having a patterned photoresist layer 18 overlying the silicon nitride layer 16 following anisotropic etching of the silicon nitride layer 16 to form a hardmask opening 20A according to the patterned photoresist layer 18. In FIG. 1B is shown an STI trench 20B following a second anisotropic etching step according to the hardmask opening 20A. Following the trench etching step, the photoresist layer 18 is removed by an ashing process. According to the prior art process, a wet etching process is carried out to isotropically etchback the silicon nitride layer 16 to increase the width of the hardmask opening 20A relative to the width of the trench opening 20B as shown in FIG. 1C thereby forming an exposed recessed area 20C. According to prior art processes, the silicon nitride layer 16 is isotropically etched back using phosphoric acid $H_3PO_4$ where the semiconductor wafer is dipped for a period of time to isotropically etch back the silicon nitride layer.

One problem according to the prior art is that the wet etchback process typically causes acidic etching damage to the STI feature surfaces including roughening of the sidewall surfaces of the trench. Acidic etching (roughening) of the STI surfaces including the sidewall surfaces can cause electrical isolation reliability concerns, for example reducing adhesion between a subsequently deposited silicon oxynitride trench liner, and enhancing undesirable doping segregation from subsequent ion implantation processes at the trench sidewalls. In some cases, the trench defects and may be severe enough to reduce a semiconductor wafer processing yield. Another problem with the prior art is that the necessity for carrying out the ex-situ wet etching process leads to increased processing times and therefore increased costs since it is necessary to remove the process wafer from the multi-chamber etching apparatus to perform the wet etchback process. Yet another shortcoming is the increased costs for safely handling and disposing of the phosphoric acid containing wet etching solution.

These and other deficiencies and shortcomings demonstrate a need in the semiconductor processing art to develop a method for increasing a width of a hardmask opening surrounding a shallow trench isolation feature following trench etching while avoiding acidic etching of shallow trench isolation features.

It is therefore an object of the invention to provide a method for increasing a width of a hardmask opening surrounding a shallow trench isolation feature following trench etching while avoiding acidic etching of shallow trench isolation features while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a shallow trench isolation feature to avoid acidic etching of trench sidewalls.

In a first embodiment according to the present invention, the method includes the steps of providing a semiconductor substrate having an overlying silicon nitride layer; photolithographically patterning the silicon nitride layer to expose a portion of the silicon nitride layer; anisotropically etching through a thickness of the portion of the silicon nitride layer to form a hardmask opening exposing a portion of the semiconductor substrate; blanket depositing a polymer layer according to a plasma deposition process including at least partially covering the sidewalls and bottom portion of the hardmask opening; and, anisotropically etching a trench opening through a thickness portion of the semiconductor substrate according to the hardmask opening.

In related embodiments, the semiconductor substrate comprises at least one of single crystalline silicon and polycrystalline silicon. Further, the step of blanket depositing a polymer layer includes at least partially filling the hardmask opening.

In another embodiment, the plasma deposition process includes supplying at least one fluoro-hydrocarbon to form a plasma for depositing the polymer layer. Further, the at least one fluoro-hydrocarbon includes fluoro-hydrocarbons with a fluorine to carbon ratio of less than about 4. Further yet, the fluoro-hydrocarbon includes $CH_2F_2$.

In another embodiment, the trench opening is anisotropically etched to have a trench opening width less than a width of the hardmask opening. Further, the trench opening width is less than the width of the hardmask opening by about 10 to about 100 nanometers.

In yet another embodiment, the trench opening is anisotropically etched such that trench corners including a top and bottom portion of the trench opening are partially rounded having a radius of curvature.

In yet a further embodiment, the method includes the step of carrying out a plasma etching ashing process following the step of anisotropically etching a trench opening to remove polymer materials including the polymer layer. Further, the steps including and following anisotropically etching through a thickness of the portion of the silicon nitride layer are carried out in a single processing chamber to comprise in-situ process steps.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with exemplary reference to a particular sequence of steps in forming a shallow trench isolation feature including the trench etching process, it will be appreciated that there are several variations in forming trench isolation features and that the present invention is applicable to those variations as long as it would be advantageous to form a trench opening having a width less than an overlying hardmask opening thereby forming an exposed recessed area surrounding the trench without the necessity of isotropically acidic etching an overlying hardmask layer, for example, a silicon nitride layer.

Figure 1A:
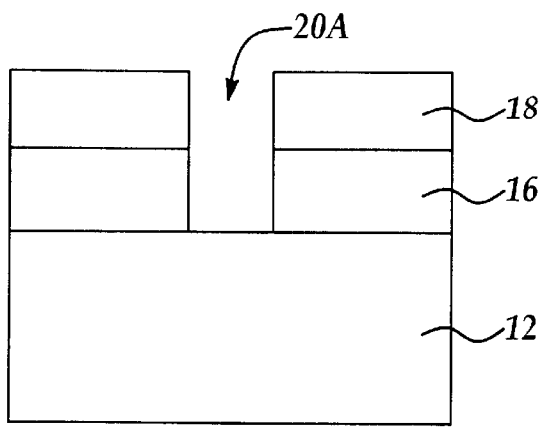
FIGS. 1A–1C are cross sectional side view representations of a portion of a semiconductor device included in a semiconductor processing wafer at a stage in manufacture showing formation of a shallow trench isolation feature according to the prior art.
Figure 1B:
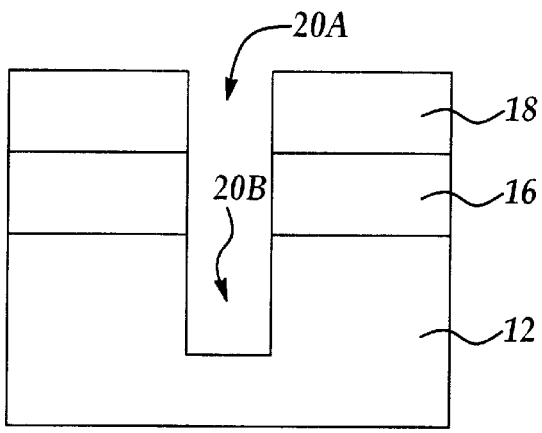
Figure 1C:
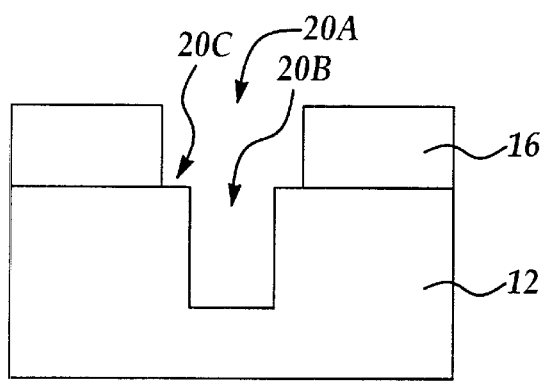
Figure 2A:
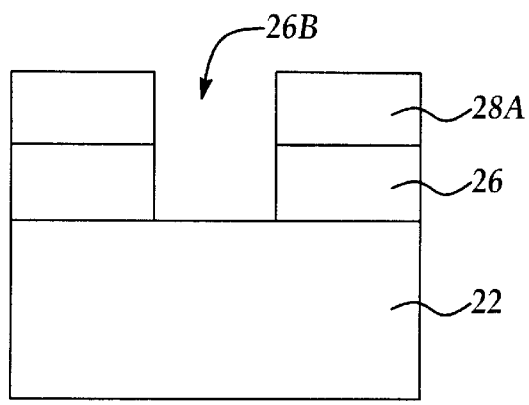
FIGS. 2A–2D are cross sectional side view representations of a portion of a semiconductor device included in a semiconductor processing wafer at a stage in manufacture showing formation of a shallow trench isolation feature according to the present invention.

In one exemplary implementation of the present invention, referring to FIG. 2A is shown a semiconductor substrate 22, for example single crystalline or polycrystalline silicon. Although not shown, a pad oxide layer, for example silicon dioxide, is preferably grown overlying the semiconductor substrate 22. For example, the pad oxide layer may optionally be formed to provide a good adhesion layer for the overlying silicon nitride layer 26 and to reduce surface stresses induced in subsequent processing steps. For example, the pad oxide layer is thermally grown by an oxidation process to a thickness of between about 100 Angstroms and 300 Angstroms using a conventional process. A silicon nitride layer 26 is deposited overlying the pad oxide layer, by for example, a low pressure chemical vapor deposition (LPCVD) process to a thickness of between about 1,000 Angstroms and 3,000 Angstroms.

Figure 2B:
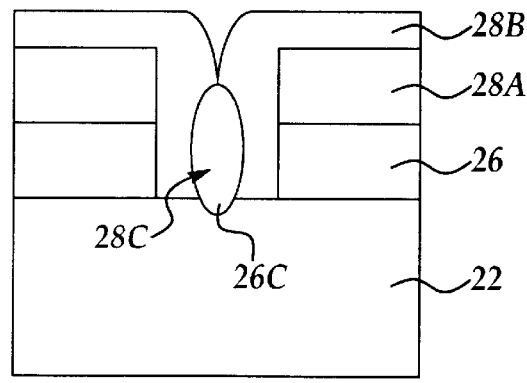

Still referring to FIG. 2A, a photoresist layer 28A is then deposited over the silicon nitride layer for photolithographically patterning an etching area exposing a portion of the silicon nitride layer 26 for anisotropically etching a hardmask pattern for subsequently anisotropically etching a trench in the substrate 22. The silicon nitride layer 26 is first etched to expose a portion of the substrate 22 to form a hardmask opening 26B according to a conventional reactive ion etch (process) having a fluoro-hydrocarbon chemistry, for example, $CF_4$. In an exemplary process the pressures are about 5 to about 20 mTorr with an RF power of about 1000 to about 1400 Watts and with a bias of about 300 to about 400 Watts. The silicon nitride layer 26 is preferably anisotropically etched through a thickness to include the pad oxide layer to expose a portion of the substrate 22 according to endpoint detection. The resulting hardmask opening 26B formed for subsequently anisotropically etching a trench in the substrate 22 is shown in FIG. 2B.

In the method according to the present invention, following etching of the silicon nitride layer to form the hardmask opening 26B, a plasma deposition process is used to deposit a polymer layer 28B over the silicon nitride layer to include at least partially covering the sidewalls and bottom portion of the hardmask opening. Preferably, a relatively carbon-rich fluoro-hydrocarbon plasma (e.g., lower fluorine to carbon ratio compared to $CF_4$) including for example, $CH_2F_2$, is used to deposit the polymer layer 28B. The polymer layer 28B is preferably blanket deposited over the silicon nitride layer 26 to include at least partially covering the sidewalls and bottom portion of hardmask opening 26B as shown in conceptual form in FIG. 2B. It will be appreciated that portions of the hardmask opening 26B may not be completely filled to form a continuous polymeric layer in the plasma polymer deposition process.

For example, the hardmask opening may include keyholes (voids) as conceptually shown at 28C depending on plasma processing parameters. During the plasma polymer deposition process having one or more carbon-rich fluoro-hydrocarbons supplied to the plasma, polymerization of plasma generated species occurs to form a polymeric residue on the semiconductor surface to include the sidewalls and bottom portion of the etched feature. It will be appreciated that carbon rich fluoro-hydrocarbon in addition to $CH_2F_2$ may be advantageously used including, for example, $C_HF_3$, $C_5F_8$ and $C_2F_6$ (where the number of carbon and fluorine atoms is represented) to form the polymer layer 28B. Preferably the fluorine to carbon ratio is less than 4, more preferably less than 3. It will further be appreciated that during the polymer deposition process some etching will occur to include partially etching the semiconductor substrate 22 as conceptually shown at 26C in FIG. 2B.

Figure 2C:
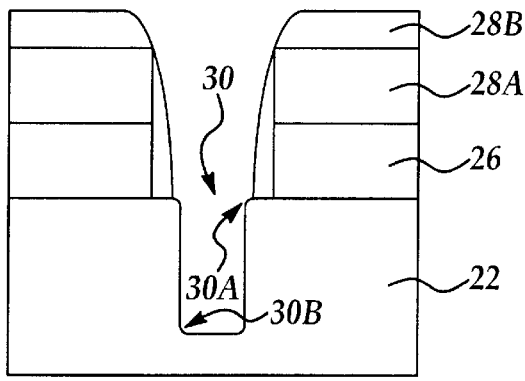

Referring to FIG. 2C, following the plasma polymer deposition process, according to the present invention, a conventional etching chemistry, including for example $Cl_2$ and HBR, is used to anisotropically etch through the polymer layer 28B and the semiconductor substrate 22 to from a shallow trench isolation opening (trench opening) 30 in the substrate 22. The trench etching process is preferably carried out in the same etching chamber as the previous polymer deposition and silicon nitride etching processes. An important aspect of the invention is the in-situ polymer deposition process to form a polymer layer 28B that functions as a polymer spacer in the hardmask opening 26B during the etching of trench 30. As a result, the etched trench opening has a width less than the hardmask opening forming an exposed recessed area surrounding the trench opening. For example the trench opening width is preferably smaller than the hardmask opening width by about 10 to about 100 nanometers.

Figure 2D:
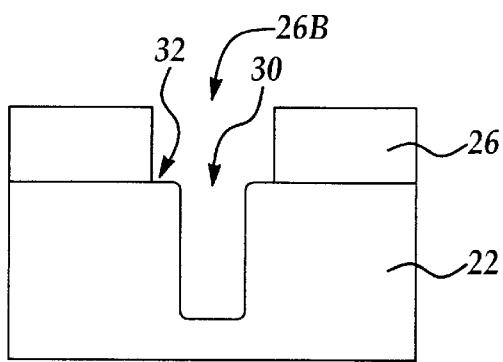

Still referring to FIG. 2D, is shown a conceptual profile of the etching process. Preferably, during the etching process, trench top portion corners at e.g., 30A and trench bottom portion corners e.g., 30B are etched such that that the trench opening corners at the top and bottom portions of the trench are slightly rounded e.g., having a radius of curvature. Such rounding is advantageous for preventing undesirable electrical behavior such as high electrical fields affecting voltage threshold (VT) in a completed device.

Referring to FIG. 2D, following etching of the trench 30, a conventional ashing process with an oxygen containing plasma is carried out to remove the polymer materials from the wafer process surface including the polymer layer and the photoresist layer as shown in FIG. 2D. Preferably, the ashing process is carried out in the same chamber as previous etching processes thereby reducing a processing time. Thus, as shown in FIG. 2D a shallow trench isolation trench opening 30 has been etched having a width than the hardmask opening 26B width to leave an exposed recessed area 32 exposing the substrate 22 surface and surrounding the anisotropically etched trench feature 30. As a result, isotropic etchback of the silicon nitride hardmask opening 26B according to the prior art has been avoided including the necessity of an ex-situ acidic wet etching process leading to acidic roughening of the STI feature surfaces.

In one embodiment of the invention, the processing steps including the silicon nitride etching step, the polymer layer deposition step, the trench etching step, and the ashing step, are preferably carried out in-situ in a single process chamber.

The shallow trench isolation feature is subsequently completed according to conventional processes, including for example, depositing an silicon oxynitride trench liner to improve electrical performance and relieve induced stresses in subsequent processing steps. Following deposition of the silicon oxynitride liner, the shallow trench opening is filled with a silicon oxide, for example by HDP-CVD deposition of TEOS, followed by CMP to remove an excess of the deposited oxide. Other conventional processes are then followed to complete the formation of the shallow trench isolation feature.

The several advantages of the present invention include the avoidance of acidic etching roughness induced on the STI opening surfaces including the sidewalls following a silicon nitride isotropic etchback. In addition, the present invention reduces processing times and costs by eliminating the shut-down and wafer transfer process time necessary for an ex-situ wet etching process. Further, the relatively higher costs associated with the safe handling and disposal of phosphoric acid are avoided.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a shallow trench isolation feature to avoid acidic etching of trench sidewalls comprising the steps of:

providing a semiconductor substrate having an overlying silicon nitride layer;

photolithographically patterning the silicon nitride layer to expose a portion of the silicon nitride layer;

plasma etching through a thickness portion of the silicon nitride layer to form a hardmask opening exposing a portion of the semiconductor substrate;

in-situ blanket depositing a polymer layer according to a plasma deposition process comprising substantially filling the hardmask opening; and, in-situ plasma etching a trench opening through a thickness portion of the semiconductor substrate through the hardmask opening such that the trench opening is formed having a width less than the hardmask opening.

2. The method of claim 1, wherein the semiconductor substrate comprises at least one of single crystalline silicon and polycrystalline silicon.

3. The method of claim 1, wherein the step of blanket depositing a polymer layer comprises at substantially filling the hardmask opening excepting keyhole formation.

4. The method of claim 1, wherein the plasma deposition process comprises supplying at least one fluoro-hydrocarbon to form a plasma for depositing the polymer layer.

5. The method of claim 4, wherein the at least one fluoro-hydrocarbon comprises fluoro-hydrocarbons with a fluorine to carbon ratio is equal to or less than about 3.

6. The method of claim 5, wherein the at least one fluoro-hydrocarbon comprises $CH_2F_2$.

7. The method of claim 1, wherein the trench opening comprises a width less than the width of the hardmask opening by about 10 to about 100 nanometers.

8. The method of claim 6, wherein the trench opening is anisotropically etched such that trench corners including a top and bottom portion of the trench opening are partially rounded having a radius of curvature.

9. The method of claim 1, further comprising the step of carrying out a plasma ashing process in-situ following the step of in-situ plasma etching a trench opening to remove the polymer layer to form a recessed area exposing the semiconductor substrate surrounding the trench opening having a combined width of about 10 to about 100 nanometers.

10. The method of claim 5, wherein the fluoro-hydrocarbons include at least one member selected from the group consisting of $CHF_3$, $C_5F_8$ and $C_2F_6$ and $CH_2F_2$.

11. A method of forming a shallow trench isolation opening to avoid roughening trench sidewalls in a wet acidic etching process comprising the steps of:

providing a semiconductor substrate having an overlying silicon nitride layer;

photolithographically patterning the silicon nitride layer to expose a portion of the silicon nitride layer;

plasma etching through a thickness of the portion of the silicon nitride layer to form a hardmask opening exposing a portion of the semiconductor substrate;

in-situ blanket depositing a polymer layer according to a plasma deposition process comprising covering the sidewalls and bottom portion of the hardmask opening such that the sidewall portions of the polymer at least partially coalesce; in-situ plasma etching a trench opening through a thickness portion of the semiconductor substrate through the hardmask opening the trench opening formed to have a trench opening width less than a width of the hardmask opening; and, in-situ plasma ashing to remove polymer materials including the polymer layer to form a recessed area exposing the semiconductor substrate surrounding the trench opening.

12. The method of claim 11, wherein the semiconductor substrate comprises at least one of single crystalline silicon and polycrystalline silicon.

13. The method of claim 11, wherein the at least one fluoro-hydrocarbon comprises fluoro-hydrocarbons with a fluorine to carbon ratio is equal to or less than about 3.

14. The method of claim 13, wherein the at least one fluoro-hydrocarbon comprises $CH_2F_2$.

15. The method of claim 11, wherein the recessed area comprises a combined width of about 10 to about 100 nanometers.

16. The method of claim 11, wherein the trench opening is plasma etched such that trench corners including a top and bottom portion of the trench opening are partially rounded having a radius of curvature.

17. The method of claim 13, wherein the fluoro-hydrocarbons include at least one member selected from the group consisting of $CHF_3$, $C_5F_8$ and $C_2F_6$ and $CH_2F_2$.

* * * * *